United States Patent
Shen et al.

(10) Patent No.: US 10,043,832 B2
(45) Date of Patent: Aug. 7, 2018

(54) DISPLAY SUBSTRATE, DISPLAY DEVICE AND DISPLAY DEVICE IDENTIFICATION METHOD

(71) Applicants: Shanghai Tianma Micro-electronics Co., Ltd., Shanghai (CN); Tianma Micro-electronics Co., Ltd., Shenzhen (CN)

(72) Inventors: Dingwei Shen, Shanghai (CN); Jingxiong Zhou, Shanghai (CN); Yiqi Wang, Shanghai (CN); Zhengfang Xie, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/873,142

(22) Filed: Jan. 17, 2018

(65) Prior Publication Data

US 2018/0145091 A1 May 24, 2018

Related U.S. Application Data

(62) Division of application No. 15/079,699, filed on Mar. 24, 2016, now Pat. No. 9,911,758.

(30) Foreign Application Priority Data

Dec. 31, 2015 (CN) .......................... 2015 1 1027846

(51) Int. Cl.
*H01L 29/18* (2006.01)
*H01L 29/06* (2006.01)
(Continued)

(52) U.S. Cl.
CPC .......... *H01L 27/124* (2013.01); *G02F 1/1309* (2013.01); *G02F 1/13458* (2013.01);
(Continued)

(58) Field of Classification Search
CPC . H01L 27/124; H01L 23/5286; H01L 23/544; H01L 2223/54413; H01L 2223/5444; G02F 1/1309; G02F 1/13458
(Continued)

(56) References Cited

U.S. PATENT DOCUMENTS 5,343,074 A 8/1994 Higgins et al.
5,406,312 A * 4/1995 Arimoto .................. G09G 3/14
345/205
(Continued)

FOREIGN PATENT DOCUMENTS

CN 102033341 B 11/2013
CN 103559856 A 2/2014

*Primary Examiner* — Dzung Tran
(74) *Attorney, Agent, or Firm* — Anova Law Group, PLLC

(57) ABSTRACT

A display substrate, a display device and a method to identify a display device are provided. The display substrate comprises a display region and a periphery region. The periphery region comprises a plurality of first bonding pads electrically connected to metal wires disposed at the display region and a plurality of second bonding pads including at least two identification bonding pads. The at least two identification bonding pads are electrically connected to voltage-level signal lines respectively, and are labeled with identify information according to voltage-level signals provide by the voltage-level signal lines.

13 Claims, 9 Drawing Sheets

(51) Int. Cl.
*H01L 27/12* (2006.01)
*G02F 1/1345* (2006.01)
*G02F 1/13* (2006.01)
*H01L 23/528* (2006.01)
*H01L 23/544* (2006.01)

(52) U.S. Cl.
CPC ........ *H01L 23/5286* (2013.01); *H01L 23/544* (2013.01); *H01L 2223/5444* (2013.01); *H01L 2223/54413* (2013.01)

(58) Field of Classification Search
USPC ...................................................... 257/9, 88
See application file for complete search history.

(56) References Cited

U.S. PATENT DOCUMENTS

| | | |
|---|---|---|
| 2001/0013663 A1 | 8/2001 | Taylor et al. |
| 2002/0020899 A1* | 2/2002 | Ohashi .................... H01L 23/50 257/678 |
| 2007/0109759 A1 | 5/2007 | Torii et al. |
| 2007/0138654 A1 | 6/2007 | Kim |
| 2008/0128902 A1* | 6/2008 | Chung ................ H01L 21/4839 257/735 |
| 2011/0075390 A1 | 3/2011 | Choi et al. |
| 2013/0234169 A1 | 9/2013 | Kim et al. |
| 2013/0335123 A1 | 12/2013 | Choi et al. |

* cited by examiner

DISPLAY SUBSTRATE, DISPLAY DEVICE AND DISPLAY DEVICE IDENTIFICATION METHOD

CROSS-REFERENCES TO RELATED APPLICATIONS

This application is a divisional application of U.S. patent application Ser. No. 15/079,699, filed on Mar. 24, 2016, which claims the priority of Chinese patent application No. 201511027846.5, filed on Dec. 31, 2015, the entire content of which is incorporated herein by reference.

FIELD OF THE DISCLOSURE

The present disclosure relates to the field of display technology and, more particularly, relates to a display substrate, a display device and a display device identification method.

BACKGROUND

With the development of modern electronic technologies, applications of display substrates become more and more broad, and requirements of display substrates become more and more diversified. Therefore, the number of display substrates with different sizes, different manufacturers, or different electrical parameters is growing. The size, place of production, thickness and electrical parameters of a display substrate are often referred as properties of the display substrate. Before processing a certain display substrate or a certain group of display substrates in a production line, whether the display substrate or the group of display substrates are the correct display substrates required by an operator needs to be confirmed first.

To facilitate the identification of the display substrates with different properties, a two-dimensional (2D) code is often disposed at a specific region of the display substrate. The 2D code contains identity information of the display substrate, which corresponds to the properties of the display substrate. Once the 2D code can be identified or recognized, the identity information of the display substrate is obtained, and the properties of the display substrate are determined accordingly. The 2D code is often identified or recognized by a specific fixture.

However, the existing technologies may have the following technical problems. On one hand, the 2D code disposed on the display substrate often has a very small area, which has to be read by a specific fixture and leads to an increased cost. Further, when one parameter of the display substrate is adjusted, the fixture may not instantly recognize the properties of the display substrate, which may cause the operator incorrectly process the display substrate. On the other hand, an external device connected to the display substrate may be unable to automatically identify the properties of the display substrate and, thus, may be unable to select a correct display initialization procedure. Thus, based on the existing technologies, the properties of the display substrate may not be easily obtained.

The disclosed display substrate, display device and display device identification method are directed to solve one or more problems set forth above and other problems.

BRIEF SUMMARY OF THE DISCLOSURE

One aspect of the present disclosure provides a display substrate. The display substrate comprises a display region and a periphery region. The periphery region comprises a plurality of first bonding pads electrically connected to metal wires disposed at the display region and a plurality of second bonding pads including at least two identification bonding pads. The at least two identification bonding pads are electrically connected to voltage-level signal lines respectively, and are labeled with identify information according to voltage-level signals provide by the voltage-level signal lines.

Another aspect of the present disclosure provides a display device. The display device comprises a display substrate and a driving chip. The display substrate comprises a display region and a periphery region. The periphery region comprises a plurality of first bonding pads electrically connected to metal wires disposed at the display region and a plurality of second bonding pads including at least two identification bonding pads. The at least two identification bonding pads are electrically connected to voltage-level signal lines respectively, and are labeled with identify information according to voltage-level signals provide by the voltage-level signal lines. The driving chip includes a plurality of first pins, a plurality of second pins and an identification circuit. The first pins are electrically connected to the first bonding pads, the second pins are electrically connected to the at least two identification bonding pads, and the identification circuit is electrically connected to the identification bonding pads through the second pins for obtaining the identify information of the display substrate according to the voltage-level signals at the identification bonding pads.

Another aspect of the present disclosure provides a method to identify a display device. The display device comprises a display substrate and a driving chip. The display substrate comprises a display region and a periphery region. The periphery region comprises a plurality of first bonding pads electrically connected to metal wires disposed at the display region and a plurality of second bonding pads including at least two identification bonding pads. The at least two identification bonding pads are electrically connected to voltage-level signal lines respectively, and are labeled with identify information according to voltage-level signals provide by the voltage-level signal lines. The driving chip includes a plurality of first pins, a plurality of second pins and an identification circuit. The first pins are electrically connected to the first bonding pads, the second pins are electrically connected to the at least two identification bonding pads, and the identification circuit is electrically connected to the identification bonding pads through the second pins for obtaining the identify information of the display substrate according to the voltage-level signals at the identification bonding pads. The method to identify a display device comprises obtaining, by the driving chip, the identify information of the display substrate according to the voltage-level signals at the identification bonding pads.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention.

Figure 1:
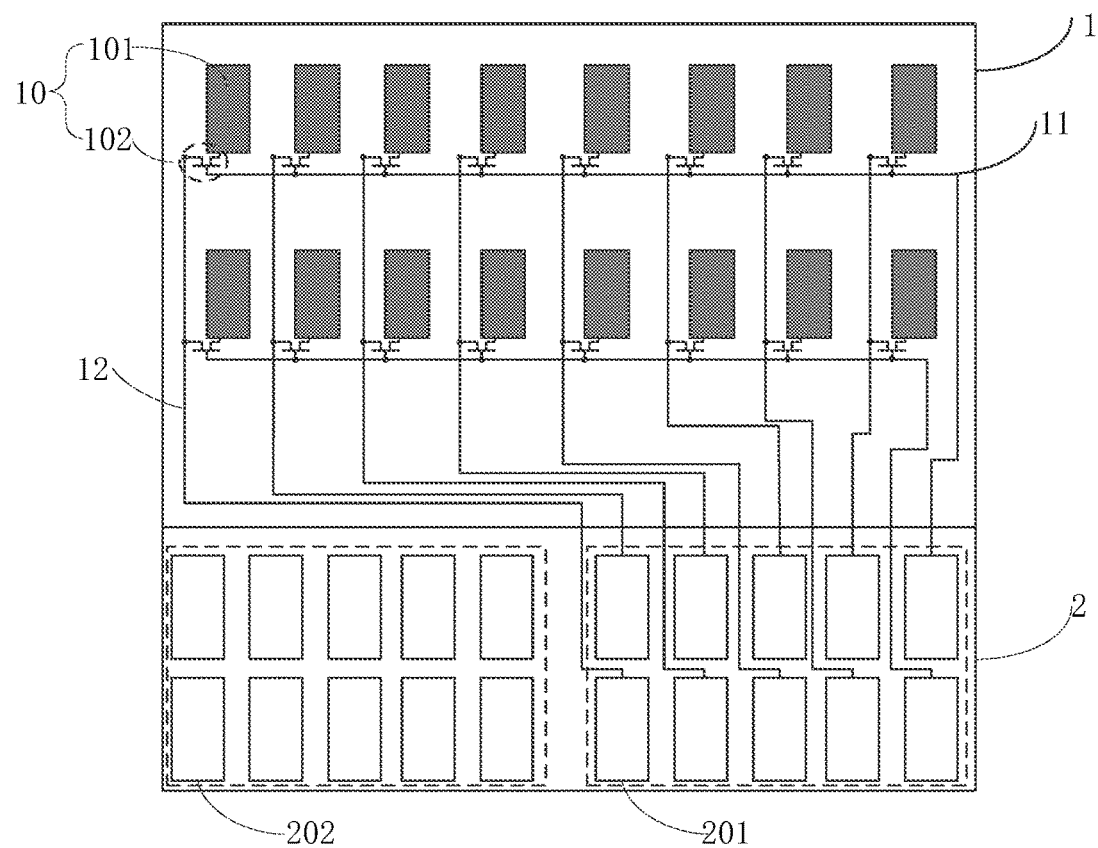
FIG. 1 illustrates a top view of a display substrate.

A display substrate may be a color film substrate or an array substrate, which may be used in the field of liquid crystal displays (LCDs) or organic light emitting diode (OLED) displays. An array substrate adopted in an LCD is illustrated as an example in the following. FIG. 1 illustrates a top view of a display substrate. As shown in FIG. 1, the display substrate is an array substrate including a display region 1 and a periphery region 2 adjacent to the display region 1. The display region 1 includes a plurality of pixel units 10 arranged in an array, and each pixel unit 10 includes a pixel electrode 101 and a thin film transistor (TFT) 102.

In particular, TFTs 102 in each row of pixel units 10 (i.e., TFTs in each pixel unit row) are electrically connected to a same scanning line 11, and TFTs 102 in each column of pixel units 10 (i.e., TFTs in each pixel unit column) are electrically connected to a same data line 12. The scanning lines 11 and the data lines 12 are often metal wires, which extend from the display region 1 to the periphery region 2.

The periphery region 2 includes a plurality of bonding pads arranged in an array. The scanning lines 11 and data lines 12 extending to the peripheral region 2 are electrically connected to certain bonding pads 201 in the peripheral region 2, while the other bonding pads 202 in the peripheral region 2 are in a dummy state, i.e., dummy bonding pads 202. The bonding pads 201 and the bonding pads 202 in the peripheral region 2 are electrically connected to corresponding bonding pads in a driving chip. The display region 1 and the metal wires (i.e., the scanning lines 11 and the data lines 12) in FIG. 1 are only for illustrative purposes. The display region in the display substrate may have other structures, and accordingly the metal wires may also be disposed in other ways.

Figure 2:
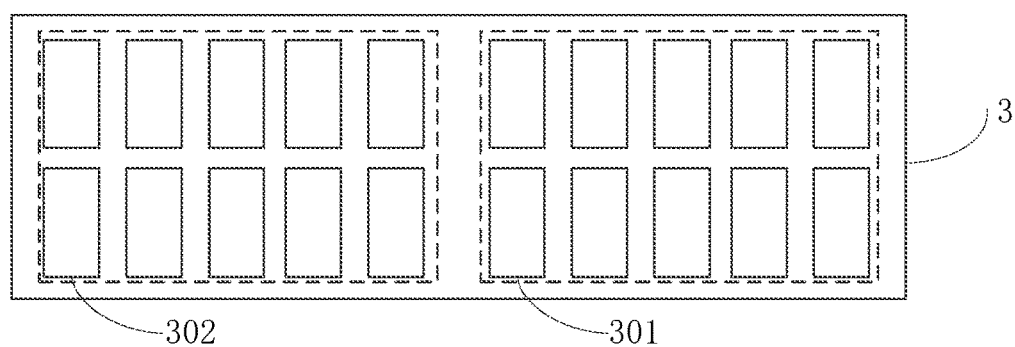
FIG. 2 illustrates a schematic diagram of a driving chip.

FIG. 2 illustrates a schematic diagram of a driving chip. As shown in FIG. 2, the driving chip 3 is connected to a display substrate and also includes a plurality of bonding pads arranged in an array. Referring to FIG. 1 and FIG. 2, certain bonding pads 301 are electrically connected to the bonding pads 201 in the peripheral region 2 of the display substrate, while the other bonding pads 302 are in the dummy state and, meanwhile, electrically connected to the dummy bonding pads 202 in the peripheral region 2 of the display substrate.

It should be noted that, the layout and the number of the pixel units, the data lines and the scanning lines disposed at the display region of the display substrate shown in FIG. 1, the layout and the number of the bonding pads disposed in the peripheral region 2 of the display substrate shown in FIG. 1, and the layout and the number of the bonding pads disposed in the driving chip 3 shown in FIG. 2, are only for illustrative purposes.

The present disclosure provides a configuration of the dummy bonding pads disposed at the peripheral region of the display substrate and the dummy bonding pads disposed at the driving chip. Thus, the dummy bonding pads disposed at the peripheral region of the display substrate and the dummy bonding pads disposed at the driving chip are going to be further illustrated.

Figure 3:
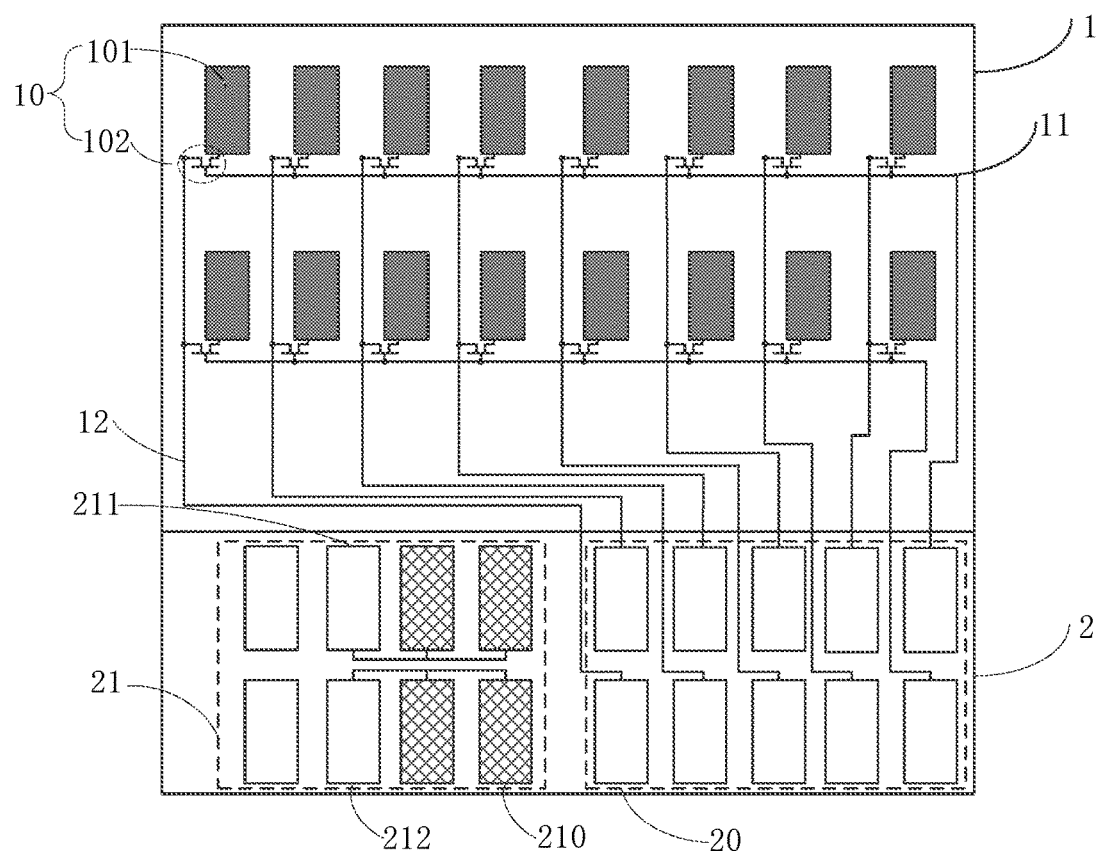
FIG. 3 illustrates a top view of an exemplary display substrate consistent with disclosed embodiments.

The present disclosure provides a display substrate. FIG. 3 illustrates a top view of an exemplary display substrate consistent with disclosed embodiments. As shown in FIG. 3, the display substrate may be a display substrate to be processed. The display substrate may include a display region 1 and a periphery region 2. The periphery region 2 may include a plurality of first bonding pads 20 and a plurality of one second bonding pads 21. The bonding pads may be electrically isolated from each other. The first bonding pads 20 and the second bonding pads 21 may include any appropriate type of metal pads for bonding or soldering, or other purposes of connecting with external signals or devices.

Although ten first bonding pads 20 and eight second boding pads 21 are shown in FIG. 3, the peripheral region 2 may include any number of first bonding pads 20 and second boding pads 21. The layout and the number of the first bonding pads 20 and second boding pads 21 disposed in the peripheral region 2 of the display substrate are only for illustrative purposes, which are not intended to limit the scope of the present disclosure.

The first bonding pads 20 may be electrically connected to metal wires extending from the display region 1 to the periphery region 2 (refer to the scanning lines and data lines extended to the periphery region shown in FIG. 1). The plurality of second bonding pads 21 may include at least two identification bonding pads 210, each of which may be electrically connected to a voltage-level signal line and may be labeled or given identity information according to a signal provided by the voltage-level signal line. The at least two identification bonding pads 210 may be connected to a same voltage-level signal line or different voltage-level signal lines. The voltage-level signal line may include any appropriate type of wires which is able to transfer voltage-level signals, for example, a high-level signal, a low-level signal, zero-level signal.

Each of the at least two identification bonding pads 210 may be electrically connected to one end of the voltage-level signal line, and the other end of the voltage-level signal line may be electrically connected to a power supply, a power device or a power supply bonding pad. The power supply or the power device may output a high-level signal or a low-level signal, which may be transferred to the identification bonding pads 210 through the voltage-level signal line, such that the identification bonding pads 210 may be labeled or given the identity information.

Further, the plurality of second bonding pads 21 may also include at least one power supply bonding pad 211 and at least one ground bonding pad 212. Each of the at least two identification bonding pads 210 may be electrically connected to the power supply bonding pad 211 or the ground bonding pad 212 through the voltage-level signal lines.

It should be noted that, the at least two identification bonding pads 210 may be electrically connected to the power supply bonding pad 211 or the ground bonding pad 212 through various electrical connections. The various electrical connections may be determined during the fabrication of the display substrate, or may be programmable according to various application scenarios.

In one embodiment, the at least two identification bonding pads 210 may be electrically connected to the power supply bonding pad 211 or the ground bonding pad 212 through one voltage-level signal line, respectively. That is, the at least two identification bonding pads 210 may be electrically connected to the power supply bonding pad 211 or the ground bonding pad 212 through different voltage-level signal lines.

In another embodiment, some of the at least two identification bonding pads 210 may be electrically connected to the power supply bonding pad 211 through one voltage-level signal line, and the remained bonding pads of the at least two identification bonding pads 210 may be electrically connected to the ground bonding pad 212 through another voltage-level signal line. That is, the some of the at least two identification bonding pads 210 may be electrically connected to the power supply bonding pad 211 through sharing one voltage-level signal line, and the remained bonding pads of the at least two identification bonding pads 210 may be electrically connected to the ground bonding pad 212 through sharing another voltage-level signal line.

In another embodiment, some of the at least two identification bonding pads 210 may be electrically connected to the power supply bonding pad 211 or the ground bonding pad 212 through different voltage-level signal lines, some of the at least two identification bonding pads 210 may be electrically connected to the power supply bonding pad 211 or the ground bonding pad 212 through sharing one voltage-level signal line, and the remained bonding pads of the at least two identification bonding pads 210 may not be electrically connected to the voltage-level signal line but may be set in a dummy state or a high-impedance state.

As described above, each identification bonding pads 210 may be connected to either the power supply bonding pad 211 or the ground bonding pad 212, through which each identification bonding pad 210 may be able to indicate different identity information. Thus, according to the electrical connections between the identification bonding pads 210 and the power supply bonding pad 211 as well as the electrical connections between the identification bonding pads 210 and the ground bonding pad 212, the identification bonding pads 210 may be able to represent different types of display substrates, as well as indicate one or more properties of the display substrates. In practical applications, the electrical connection between the at least two identification bonding pads 210 and the voltage-level signal lines may be flexibly configured according to various user requirements.

Further, some of the at least two identification bonding pads 210 may be electrically connected to the power supply bonding pad 211 through the corresponding voltage-level signal line, and the remained bonding pads of the at least two identification bonding pads 210 may be electrically connected to the ground bonding pad 212 through the corresponding voltage-level signal line.

The power supply bonding pad 211 and the ground bonding pad 212 may provide signals of different levels (e.g., high-level signal, low-level signal, zero-level signal) to the electrically connected identification bonding pads 210, respectively. For example, the power supply bonding pad 211 may provide a high-level signal to the electrically connected identification bonding pads 210, while the ground bonding pad 212 may provide a low-level signal to the electrically connected identification bonding pads 210.

The power supply bonding pad 211 may be electrically connected to a power wire, and the ground bonding pad 212 may be electrically connected to the ground wire.

In one embodiment, the periphery region 2 of the display substrate may include four identification bonding pads 210, as shown in FIG. 3. Among the four identification bonding pads 210, two identification bonding pads 210 may be electrically connected to the power supply bonding pad 211 through one voltage-level signal line, and the other two identification bonding pads 210 may be electrically connected to the ground bonding pad 212 through another voltage-level signal line.

The power supply bonding pad 211 may provide a high-level signal, such that the two identification bonding pads 210 electrically connected to the power supply bonding pad 211 may be set at a high level. The ground bonding pad 212 may provide a low-level signal, such that the two identification bonding pads 210 electrically connected to the ground bonding pad 212 may be set at a low level. Thus, at least four identification bonding pads 210 may be labeled or given identity information through being connected to power supply bonding pad 211 or the ground bonding pad 212.

The identity information may represent one or more properties of the display substrate. The properties of the display substrate may include the place of production, size, thickness, electrical properties, batch code, date of production, status of production, serial number, etc. A driving chip may read the identity information of each identification bonding pad 210 to obtain one or more properties of the display substrate.

For example, the high-level signal may be set as "1", and the low-level signal may be set as "0", thus, the two identification bonding pads 210 electrically connected to the power supply bonding pad 211 may be set at "1" and the two identification bonding pads 210 electrically connected to the ground bonding pad 212 may be set at "0". The at least four identification bonding pads 210 may be labeled as "1" or "0", respectively. Such a combination of "0" and "1". i.e., identity information, may represent one or more properties of the display substrate.

Further, the at least two identification bonding pads 210 may be divided into at least two groups. Each group may correspond to one piece of identity information, which may correspond to one or more properties of the display substrate.

For example, as shown in FIG. 3, the display substrate may include four identification bonding pads 210, which may be divided into two groups: a first group and a second group.

In one embodiment, the first group may include two identification bonding pads 210, whose identity information may correspond to the place of production of the display substrate. The second group may include the other two identification bonding pads 210, whose identity information may correspond to the size of the display substrate.

In another embodiment, the first group may include two identification bonding pads 210, whose identity information may correspond to the place of production and the size of the display substrate. The second group may include the other two identification bonding pads 210, whose identity information may correspond to the electrical properties, date of production, and serial number of the display substrate.

It should be noted that, referring to FIG. 1 and FIG. 3, the first bonding pads 20 in the periphery region 2 of the display substrate shown in FIG. 3 may be the bonding pads 201 shown in FIG. 1, both of which may be electrically connected to the metal wires (i.e., the scanning lines or the data lines) extending from the display region 1 to the periphery region 2. The second bonding pads 21 in the periphery region 2 of the display substrate shown in FIG. 3 may be the dummy bonding pads 202 shown in FIG. 1. Further, the plurality of second bonding pads 21 in the periphery region 2 of the display substrate shown in FIG. 3 may also include the power supply bonding pad 211, the ground bonding pad 212 and the identification bonding pads 210.

In the disclosed embodiments, the periphery region 2 of the display substrate may include at least two identification bonding pads 210 electrically connected to one or more voltage-level signal lines. Based on the voltage-level signals provided by the voltage-level signal lines, the at least two identification bonding pads 210 may be labeled or given the identity information respectively. The identity information may correspond to one or more properties of the display substrate. Thus, the driving chip may be able to acquire one or more properties of the display substrate through reading the identity information.

The disclosed display substrate may solve one or more problems in the existing technologies. That is, the 2D code may be no longer required to be disposed on the display substrate, and accordingly the specific fixture to read the 2D code to acquire the properties of the display substrate may not be required. Thus, the cost to acquire the properties of the display substrate may be reduced, while the efficiency may be increased. Further, the external device connected to the display substrate may be able to automatically identify the properties of the display substrate and select a correct display initialization procedure.

It should be noted that, in the disclosed embodiments, the plurality of bonding pads (i.e., the plurality of first bonding pads 20 and the plurality of second boding pads 21) in the periphery region 2 of the display substrate are not differentiated into different bonding pads (i.e., the identification bonding pad, the power supply bonding pad, and the ground bonding pad), but are named differently according to a specific application scenario or a setting created by a specific technical staff. In other application scenarios or according to other settings created by different technical staffs, the power supply bonding pad may be the identification bonding pad or the ground bonding pad, the ground bonding pad and the identification bonding pad may also be pads for other purposes, etc.

However, disposing bonding pads for particular purposes in the periphery region of the display substrate is not excluded from the present disclosure. That is, the bonding pads disposed in the periphery region of the display substrate may have particular purposes. For example, a certain type of the bonding pads disposed in the periphery region of the display substrate may be only used as the identification bonding pad, the power supply bonding pad, or the ground bonding pad. Thus, disposing bonding pads for particular purposes in the periphery region of the display substrate is still within the scope of the present disclosure.

Figure 10:
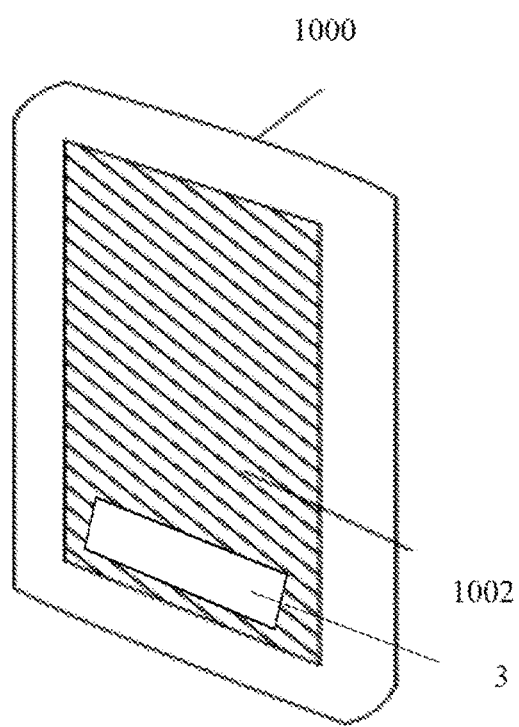
FIG. 10 illustrates a schematic diagram of an exemplary display device consistent with disclosed embodiments.

The present disclosure further provides a display device. FIG. 10 illustrates a schematic diagram of an exemplary display device consistent with disclosed embodiments. As shown in FIG. 10, the display device 1000 may include a driving chip 3 and any of the disclosed display substrates 1002. The display device 1000 may be a tablet including any of the disclosed display substrates 1002. The display device 1000 may also be a TV, a smartphone, a notebook, and a smartwatch including any of the disclosed display substrates 1002, etc. Further, the display device 1000 may be any appropriate type of content-presentation devices including any of the disclosed display substrates 1002.

Figure 4A:
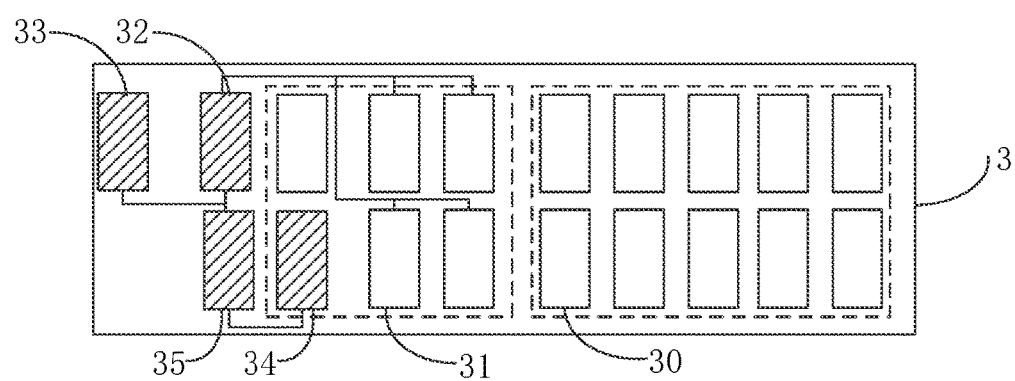
FIG. 4a illustrates a schematic diagram of a driving chip in an exemplary display device consistent with disclosed embodiments.

FIG. 4a illustrates a schematic diagram of an exemplary driving chip in an exemplary display device consistent with disclosed embodiments. As shown in FIG. 4a, the driving chip 3 may be disposed on the display substrate and may include a plurality of first pins 30, a plurality of second pins 31 and an identification circuit 32. The driving chip 3 may also include a determination module 33, an input-output (I-O) port 34 and a memory 35. Although ten first pins 30 and four second pins 31 are shown in FIG. 4a, the driving chip 3 may include any number of first pins 30 and second pins 31. The layout and the number of the first pins 30 and second pins 31 disposed in the driving chip 3 are only for illustrative purposes, which are not intended to limit the scope of the present disclosure.

Figure 4B:
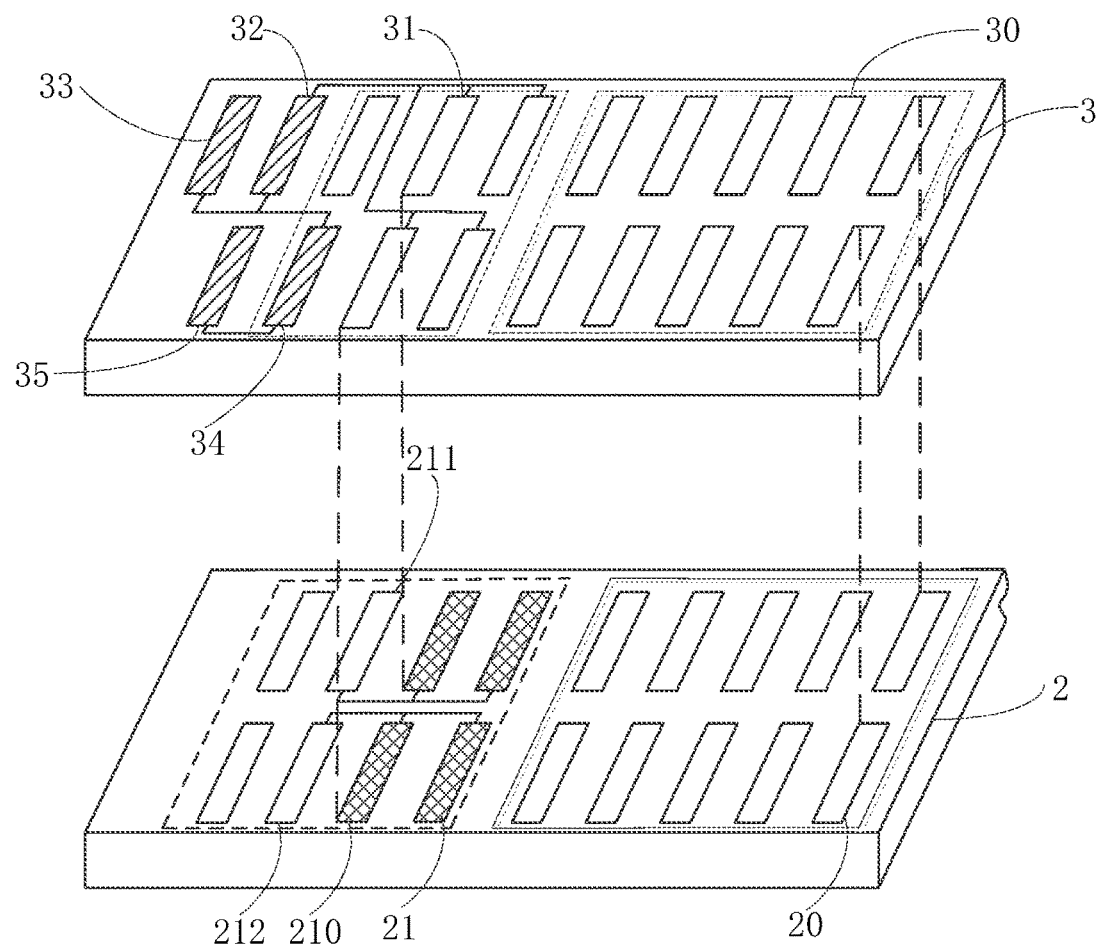
FIG. 4b illustrates an electrical connection between a driving chip and a periphery region of an exemplary display substrate consistent with disclosed embodiments.

FIG. 4b illustrates an electrical connection between a driving chip and a periphery region in an exemplary display substrate consistent with disclosed embodiments. FIG. 4b only illustrates the periphery region 2 of the display substrate. The display region 1 of the display substrate as well as the electrical connection between the metal wires in the display region 1 and the first bonding pad 20 in the periphery region 2 may be referred to FIG. 3, which are not repeated here.

As shown in FIG. 4b, the plurality of first pins 30 at the driving chip 3 may be one-to-one electrically connected to the plurality of first bonding pads 20 at the periphery region 2 of the display substrate. For example, as shown in FIG. 4b, the ten first pins 30 at the driving chip 3 may be one-to-one electrically connected to the ten first bonding pads 20 at the periphery region 2 of the display substrate. Meanwhile, the plurality of second pins 31 at the driving chip 3 may be one-to-one electrically connected to the plurality of identification bonding pads 210 in the second bonding pads 21 at the periphery region 2 of the display substrate. For example, as shown in FIG. 4*b*, the four second pins 31 at the driving chip 3 may be one-to-one electrically connected to the four identification bonding pads 210 (i.e., the four boding pads filled with the outlined diamond pattern) at the periphery region 2 of the display substrate.

The identification circuit 32 in the driving chip 3 may be electrically connected to the identification bonding pads 210 through the second pins 31, for obtaining the identity information of the display substrate according to the voltage-level signals at the identification bonding pads 210.

After obtaining the identity information of the display substrate to be processed, the identification circuit 32 may process the identity information in various approaches. For example, in one embodiment, the driving chip may pre-store identity information of a display substrate, for example, identity information of a template display substrate. The obtained identity information of the display substrate to be processed may be matched with the identity information of the template display substrate.

In another embodiment, the obtained identity information of the display substrate may be outputted to a terminal or a chip capable of identifying and processing the identity information of the display substrate to be processed. In another embodiment, the obtained identity information of the display substrate may be outputted to a terminal capable of displaying, such that the operator may be able to read the identity information of the display substrate to processed.

To match the obtained identity information of the display substrate to be processed with the identity information of the template display substrate pre-saved in the driving chip 3, the driving chip 3 may also include the determination module 33 for determining whether the obtained identity information is consistent with the pre-saved identity information.

To output the obtained identity information of the display substrate to be processed, the driving chip 3 may also include the input-output (I-O) port 34 for outputting the obtained identity information. In one embodiment, the obtained identity information may be outputted to a terminal capable of displaying, such that the obtained identity information may be displayed on a screen for an operator to read.

In another embodiment, the obtained identity information of the display substrate may be outputted to a chip, which may analyze the obtained identity information and determine a corresponding display initialization procedure. Based on the display initialization procedure, the chip may issue operating instructions to the driving chip 3, and process the display substrate electrically connected to the driving chip 3. In another embodiment, the obtained identity information may be outputted to the terminal capable of displaying and, meanwhile, outputted to the chip capable of identifying the obtained identity information and determining the corresponding display initialization procedure.

It should be noted that, in addition to being used for outputting the obtained identity information of the display substrate, the I-O port 34 may also be used for receiving the display initialization procedure corresponding to the obtained identity information. The driving chip 3 may also include the memory 35 for storing the display initialization procedure. Because the display initialization procedure is directly stored in the driving chip 3, the driving chip 3 may be able to process the display substrate directly. For example, the driving chip 3 may reset the TFTs controlling the pixel units in the display substrate, and determine the display mode of the pixel units, etc., according to the display initialization procedure.

The identity information obtained by the driving chip 3 may be corresponding to the properties of the display substrate, which may include one or more properties, such as the place of production, size, thickness, electrical properties, batch code, date of production, status of production, serial number, etc.

To indicate different properties of the display substrate through the identity information of the at least two identification bonding pads 210 disposed at the display substrate, the at least two identification bonding pads 210 may be divided into at least two groups, and the identification circuit 32 may acquire the identity information of the display substrate. In particular, the identification circuit 32 may acquire at least two pieces of identity information of the display substrate, and each piece of identity information may correspond to at least one property of the display substrate.

Figure 4C:
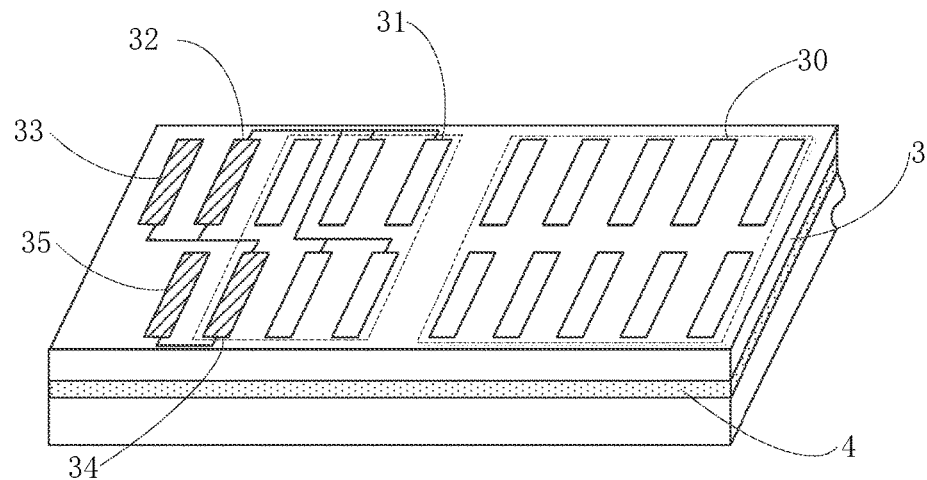
FIG. 4c illustrates a schematic diagram of an exemplary display device using a conductive adhesive to realize an electrical connection consistent with disclosed embodiments.

Further, the first pins 30 may be electrically connected to the first bonding pads 20 through the voltage-level signal lines or a conductive adhesive, and the second pins 31 may also be electrically connected to identification bonding pads 210 in the second bonding pads 21 through the voltage-level signal lines or the conductive adhesive. FIG. 4*c* illustrates a schematic diagram of an exemplary display device using a conductive adhesive to realize an electrical connection consistent with disclosed embodiments For illustrative purposes, FIG. 4*c* only illustrates the periphery region 2 of the display substrate. The display region 1 of the display substrate as well as the electrical connection between the metal wires in the display region 1 and the first bonding pad 20 in the periphery region 2 may be referred to FIG. 3, which are not repeated here. The structure of the display substrate may be referred to FIG. 3, and the structure of the driving chip may be referred to FIG. 4*a*.

It should be noted that, the first pins 30 in the driving chip 3 shown in FIGS. 4*a*-4*c* may be the bonding pads 301 shown in FIG. 2, which may be the pads electrically connected to the first bonding pads 20 in the periphery region 2 of the display substrate. The plurality of the second pins 31 in the driving chip 3 and the I-O port 34 shown in FIGS. 4*a*-4*c* may be the dummy bonding pads 302 shown in FIG. 2. The identification circuit 32, the determination module 33 and the memory 35 may be circuit modules included in the driving chip 3. In particular, after determining the properties of the display substrate, the driving chip 3 may receive the display initialization procedure through the I-O port 34, then save the display initialization procedure in the memory 35.

Further, the bonding pads 21 in the periphery region 2 of the display substrate shown in FIG. 3 may have some unused dummy bonding pads, and the bonding pads 31 in the driving chip 3 shown in FIG. 4*a* may also have some unused dummy bonding pads. That is, the periphery region of the display substrate and the driving chip may include a large number of dummy bonding pads. In the disclosed embodiments, only certain dummy bonding pads may be used to indicate the identity information, while the other unused dummy bonding pads may remain in the periphery region of the display substrate and the driving chip.

Figure 5:
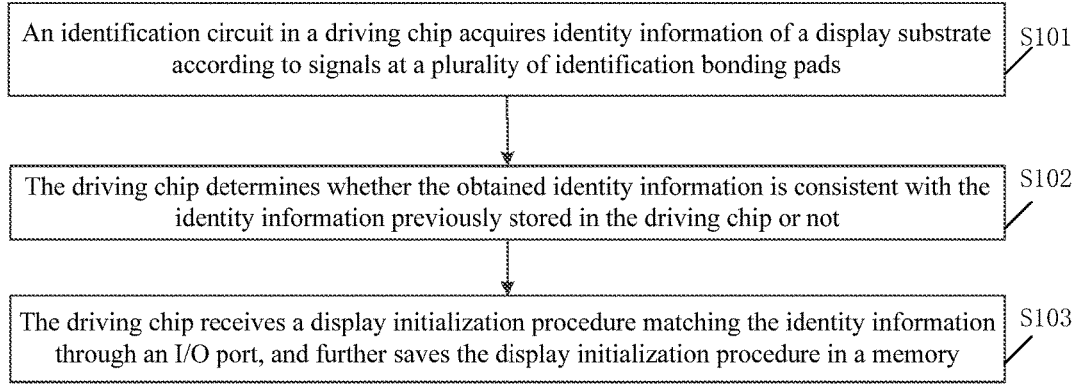
FIG. 5 illustrates a flow chart of an exemplary display substrate identification method consistent with disclosed embodiments.

FIG. 5 illustrates a flow chart of an exemplary display substrate identification method consistent with disclosed embodiments. The display substrate may be any one of the disclosed display substrates, and the corresponding concepts and explanation of the display substrates may be referred to the descriptions of the disclosed display substrates.

Figure 6:
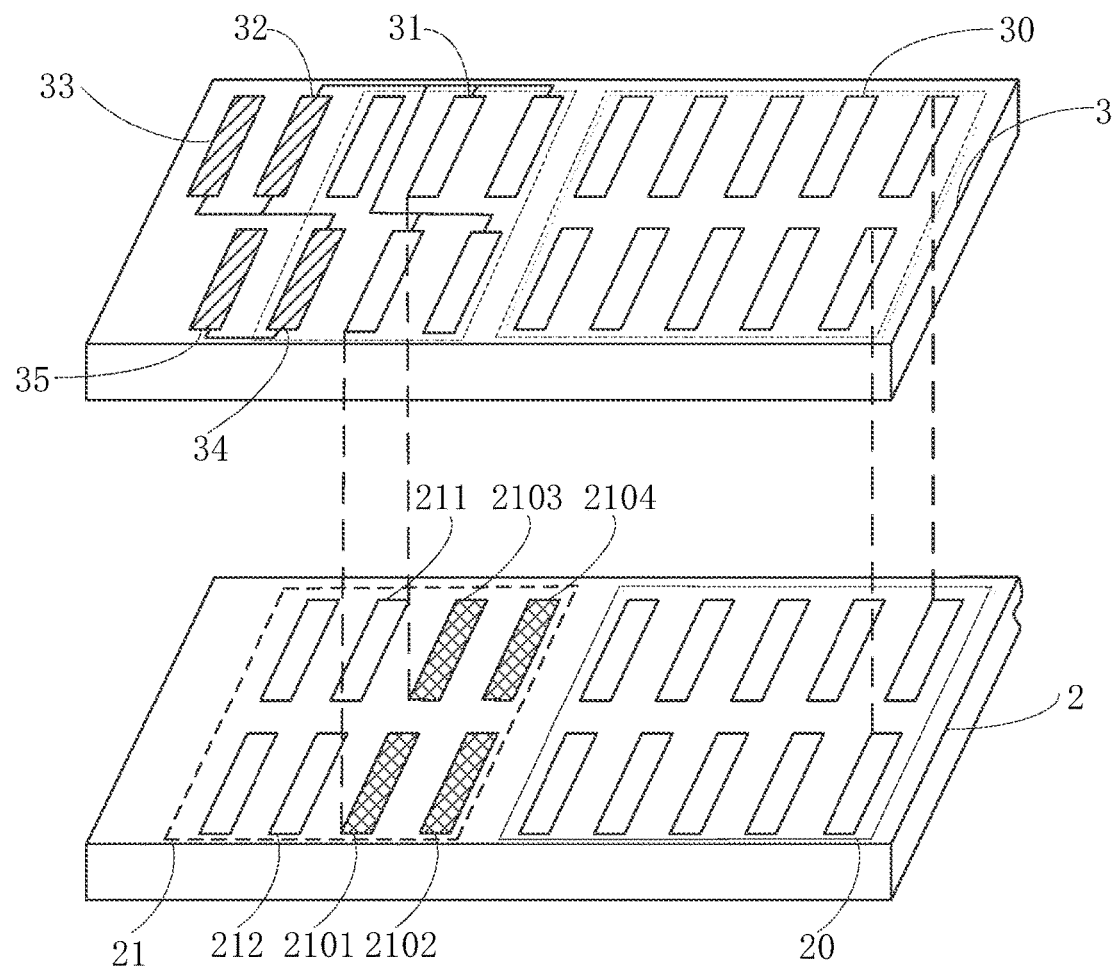
FIG. 6 illustrates a schematic diagram of another exemplary display device consistent with disclosed embodiments.

To better explain the display substrate identification method shown in FIG. 5, the display substrate identification method is implanted into a display device. FIG. 6 illustrates a schematic diagram of another exemplary display device consistent with disclosed embodiments. FIG. 6 only illustrates the periphery region of the display substrate, and the structure of the display region of the display substrate may be referred to FIG. 3, which are not repeated here.

As shown in FIG. 5, at the beginning, an identification circuit in a driving chip acquires identity information of a display substrate according to signals at a plurality of identification bonding pads (S101).

A plurality of first pins disposed at the driving chip may be connected to a plurality of first bonding pads disposed at the display substrate through a conductive adhesive, and a plurality of second pins disposed at the driving chip may be electrically connected to at least two identification bonding pads disposed at the display substrate through the conductive adhesive. An identification circuit at the driving chip may be electrically connected to the at least two identification bonding pads at the display substrate through the second pins.

The identification circuit may acquire the signals at the identification bonding pads through the second pins, then analyze the signals, e.g., analyze whether each signal is a high-level signal, a low-level signal or a zero-level signal.

The identification bonding pads in the display substrate may be electrically connected to at least one power supply bonding pad or at least one ground bonding pad. When one or more identification bonding pads are electrically connected to the power supply bonding pad through voltage-level signal line, in which the power supply bonding pad is electrically connected to a power wire, the identification bonding pads may be set at a high level. That is, the signals at the identification bonding pads electrically connected to the power supply bonding pad may be set at a high level. Then the identification circuit in the driving chip may recognize the identity information of the identification bonding pads as 1.

The remained identification bonding pads in the display substrate may be electrically connected to the ground bonding pad through the voltage-level signal lines, in which the ground bonding pad may be electrically connected to the ground wire. The remained identification bonding pads may be set at a low level, i.e., the signals at the identification bonding pads electrically connected to the ground bonding pad may be set at a low level. Then the identification circuit in the driving chip may recognize the identity information of the remained identification bonding pads as 0.

After recognizing the signal of each identification bonding pad, the identification circuit may combine or group the signals, for example, into a combined signal, according to a predetermined order of the identification bonding pads. The combined signal may represent the identify information of the display substrate.

In particular, the predetermined order of the identification bonding pads may be an order manually set (e.g., set by a technical staff), or a default order determined by the identification circuit in the driving chip. The predetermined order may be used to manage all the identification bonding pads in a more convenient and unified way, or may be used to distinguish the identification bonding pads having different identity information. Thus, the identify information of the display substrate, which is represented by the combined signal, may become more versatile.

Referring to FIG. 6, the periphery region 2 of the display substrate may include ten first bonding pads 20 and eight second bonding pads 21. In particular, the eight second bonding pads 21 may include a power supply bonding pad 211, a ground bonding pad 212 and four identification bonding pads 210 (i.e., a first identification bonding pad 2101, a second identification bonding pad 2102, a third identification bonding pad 2103, and a fourth identification bonding pad 2104), while the remained two second boding pads 21 but may be set in a dummy state or a high-impedance state. The driving chip 3 may include ten first pins 30, four second pins 31, an identification circuit 32, a determination module 33, an input-output (I-O) port 34 and a memory 35.

Although ten first bonding pads 20 and eight second boding pads 21 are shown in FIG. 6, the peripheral region 2 may include any number of first bonding pads 20 and second boding pads 21. The layout and the number of the first bonding pads 20 and second boding pads 21 disposed in the peripheral region 2 of the display substrate are only for illustrative purposes, which are not intended to limit the scope of the present disclosure Although ten first pins 30 and four second pins 31 are shown in FIG. 6, the driving 3 may include any number of first pins 30 and second pins 31. The layout and the number of the first pins 30 and second pins 31 disposed in the driving chip 3 are only for illustrative purposes, which are not intended to limit the scope of the present disclosure.

In particular, the first bonding pads 20 at the display substrate may be electrically connected to the first pins 30 in the driving chip 3, the four identification bonding pads 210 at the display substrate may be electrically connected to the four second pins 31 in the driving chip 3, respectively. The identification circuit 32 in the driving chip 3 may be electrically connected to the four second pins 31 in the driving chip 3 through the voltage-level signal lines.

When the four identification bonding pads 210 at the periphery region 2 of the display substrate are not divided into different groups, the identity information indicated by the four identification bonding pads 210 may together represent one or more properties of the display substrate.

In one embodiment, the identity information indicated by the four identification bonding pads 210 may together represent one property of the display substrate, for example, place of production. Table 1 illustrates a correspondence between place of production and identify information. As shown in Table 1, the identity information indicated by the four identification bonding pads 210 (i.e., the first identification bonding pad 2101, the second identification bonding pad 2102, the third identification bonding pad 2103, and the fourth identification bonding pad 2104) may together represent one property of the display substrate, i.e., the place of production.

TABLE 1

| Place of production vs. identity information | | |
| --- | --- | --- |
| Display substrate | Place of production | Identity information |
| Display substrate A | Shanghai | 1011 |
| Display substrate B | Chengdu | 1010 |
| Display substrate C | Beijing | 0101 |
| Display sub state D | Tianjin | 0111 |

Figure 7A:
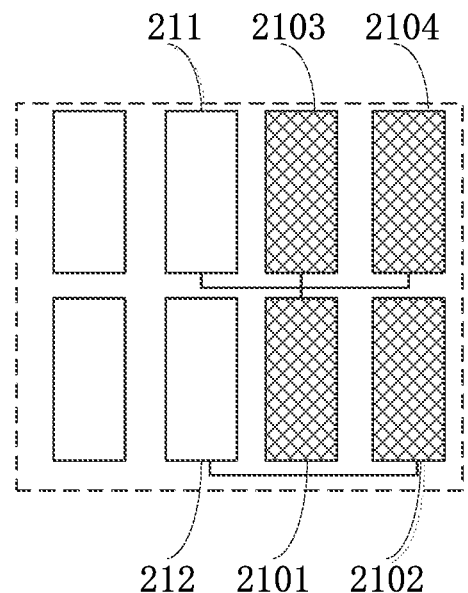
FIG. 7a illustrates an enlarged diagram of an electrical connection among four identification bonding pads 210, a power supply bonding pad 221 and a ground bonding pad 212 when identity information is 1011.

FIG. 7a illustrates an enlarged diagram of an electrical connection among the four identification bonding pads 210, the power supply bonding pad 211 and the ground bonding pad 212 when the identity information is 1011. As shown in FIG. 7a, the first identification bonding pad 2101, the third identification bonding pad 2103, and the fourth identification bonding pad 2104 may be electrically connected to the power supply bonding pad 211, respectively. Meanwhile, the second identification bonding pad 2102 may be electrically connected to the ground bonding pad 212. Referring to Table 1, the identity information 1011 indicated by the four identification bonding pads 210 of the display substrate may reveal that the place of production is Shanghai. The four identification bonding pads 2101-2104 may be arranged in an array, for example, a 2×2 array as shown in FIG. 7a.

Figure 7B:
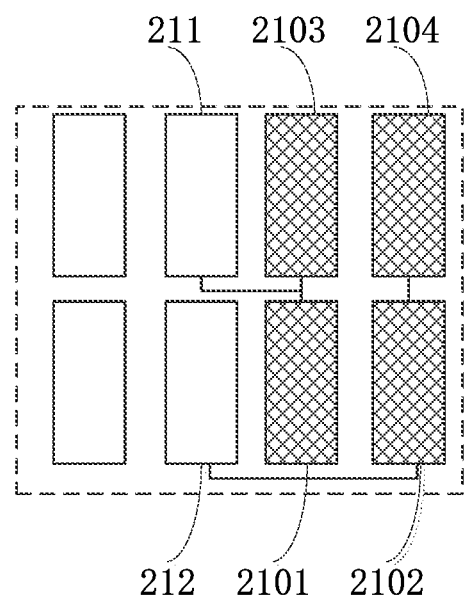
FIG. 7b illustrates an enlarged diagram of an electrical connection among four identification bonding pads 210, a power supply bonding pad 221 and a ground bonding pad 212 when identity information is 1010.

FIG. 7b illustrates an enlarged diagram of an electrical connection among the four identification bonding pads 210, the power supply bonding pad 211 and the ground bonding pad 212 when the identity information is 1010. As shown in FIG. 7b, the first identification bonding pad 2101 and the third identification bonding pad 2103 may be electrically connected to the power supply bonding pad 211, respectively. Meanwhile, the second identification bonding pad 2102 and the fourth identification bonding pad 2104 may be electrically connected to the ground bonding pad 212, respectively. Referring to Table 1, the identity information 1010 indicated by the four identification bonding pads 210 of the display substrate may reveal that the place of production is Chengdu.

FIG. 7a and FIG. 7b illustrate the enlarged diagram of the electrical connection among the four identification bonding pads 210, the power supply bonding pad 211 and the ground bonding pad 212 when the identity information is 1011 and 1010, respectively. According to the electrical connections shown in FIG. 7a and FIG. 7b, the electrical connections corresponding to the remained identify information (i.e., 0101 and 0111) in Table 1 may also be determined, which may not be illustrated here.

Returning to FIG. 6, to label the four identification bonding pads 210 with the identify information of 1010, the first identification bonding pad 2101 and the third identification bonding pad 2103 may be electrically connected to the power supply bonding pad 211 through the voltage-level signal lines, respectively. Meanwhile, the second identification bonding pad 2102 and fourth identification bonding pad 2104 may be electrically connected to the ground bonding pad 212 through the voltage-level signal lines, respectively. Thus, the first identification bonding pad 2101 and the third identification bonding pad 2103 may be set at a high level, respectively, and the second identification bonding pad 2102 and fourth identification bonding pad 2104 may be set at a low level, respectively.

The identification circuit 32 in the driving chip 3 may recognize the signal or identity information of the four identification bonding pads 201 as 1,0,1,0, respectively. Further, the identification circuit 32 may combine or group the four identification bonding pads 210, for example, into a combined signal, according to the order of the four identification bonding pads 210, i.e., from the first identification bonding pad 2101 to the fourth identification bonding pad 2104. Thus, the combined signal may be 1010, i.e., the obtained identity information of the display substrate to be processed may be 1010.

Returning to FIG. 5, after the identification circuit in the driving chip obtains the identity information of the display substrate according to the signals at the identification bonding pads, the driving chip determines whether the obtained identity information is consistent with the identity information previously stored in the driving chip or not (S102).

The driving chip may match the obtained identity information with the identity information pre-saved in the driving chip. If the obtained identity information is consistent with the identity information previously stored in the driving chip, the driving chip may determine the display substrate is the one required by the operator.

Referring to FIG. 6, one or more pieces of identity information may be pre-saved in the driving chip 3, which may be used to analyze the obtained identity information of the display substrate to be processed. For example, referring to Table 1, when the identity information indicated by the four identification bonding pads 210 together represents one property of the display substrate, the identity information 1010 indicating Chengdu may be pre-saved in the driving chip 3. That is, the pre-saved identity information may be 1010.

After the identification circuit 32 in the driving chip 3 obtains the identity information indicated by the four identification bonding pads 210 through the four second pins 31, the driving chip 3 may determine whether the obtained identity information is consistent with the identity information pre-saved in the driving chip, through comparing the obtained identity information and the pre-saved identity information. Because the obtained identity information of the display substrate to be processed is 1010 and the pre-saved identity information is also 1010, the driving chip 3 may determine the obtained identity information (i.e., 1010) is consistent with the pre-saved identity information (i.e., 1010), and confirm the display substrate to be processed is correctly used, for example, in a production line.

Returning to FIG. 5, after the driving chip determines the obtained identity information is consistent with the identity information previously stored in the driving chip, the driving chip receives a display initialization procedure matching the identity information through an I-O port, and further saves the display initialization procedure in a memory (S103).

In particular, after determining the display substrate is the one required by the operator, the driving chip may send an instruction of receiving a display initialization procedure matching the obtained identity information to an electrically connected terminal or other electrically connected chips. The terminal or the other chips may return the display initialization procedure to the driving chip through the I-O port, then the driving chip may save the display initialization procedure in the memory.

Referring to FIG. 6, the driving chip 3 may receive a display initialization procedure matching the identity information (i.e., 1010) through the I-O port 34, and further save the display initialization procedure in the memory 35. Based on the display initialization procedure, the driving chip 3 may provide electrical signals to the display substrate for display images.

Further, in another embodiment, the identity information indicated by the four identification bonding pads 210 may together represent three properties of the display substrate, for example, place of production, size, and date of production. Table 2 illustrates a correspondence among place of production, size, date of production and identify information.

TABLE 2

Place of production, size and date of production vs. identity information

| Display substrate | Properties | | | Identity information |
|---|---|---|---|---|
| | Place of production | Size(inch) | Date of production | |
| Display substrate A | Beijing | 15 | 2014. 6 | 1100 |
| Display substrate B | Shanghai | 20 | 2014.10 | 1101 |
| Display substrate C | Chengdu | 25 | 2015.4 | 0001 |
| Display substrate D | Tianjin | 30 | 2015.11 | 0011 |

As shown in Table 2, the identity information indicated by the four identification bonding pads 210 (i.e., the first identification bonding pad 2101, the second identification bonding pad 2102, the third identification bonding pad 2103, and the fourth identification bonding pad 2104) may together represent three properties of the display substrate, i.e., place of production, size and date of production.

Figure 8A:
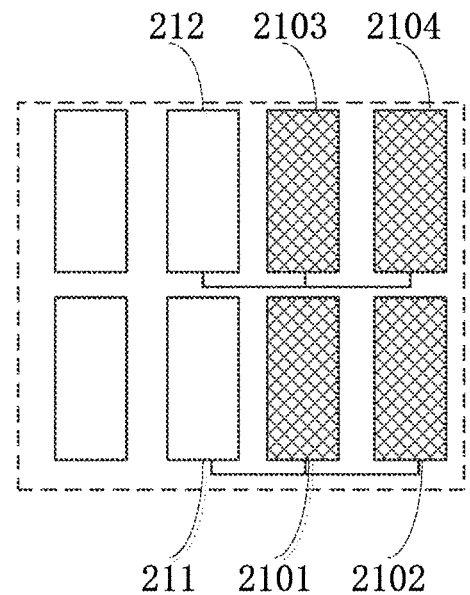
FIG. 8a illustrates an enlarged diagram of an electrical connection among four identification bonding pads 210, a power supply bonding pad 221 and a ground bonding pad 212 when identity information is 0011.

FIG. 8a illustrates an enlarged diagram of an electrical connection among the four identification bonding pads 210, the power supply bonding pad 211 and the ground bonding pad 212 when the identity information is 0011. As shown in FIG. 8a, the third identification bonding pad 2102 and the fourth identification bonding pad 2103 may be electrically connected to the power supply bonding pad 211, respectively. Meanwhile, the first identification bonding pad 2101 and the second identification bonding pad 2104 may be electrically connected to the ground bonding pad 212, respectively. Referring to Table 2, the identity information 0011 indicated by the four identification bonding pads 210 of the display substrate may reveal that the place of production is Tianjin, the size is 30 inch and the date of production is 2015 November.

Figure 8B:
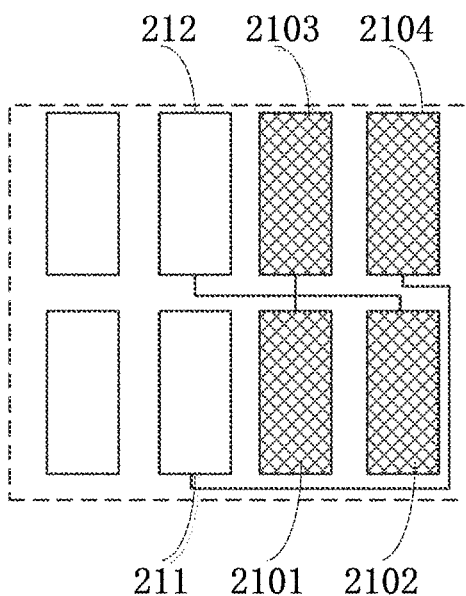
FIG. 8b illustrates an enlarged diagram of an electrical connection among four identification bonding pads 210, a power supply bonding pad 221 and a ground bonding pad 212 when identity information is 0001.

FIG. 8b illustrates an enlarged diagram of an electrical connection among the four identification bonding pads 210, the power supply bonding pad 211 and the ground bonding pad 212 when the identity information is 0001. As shown in FIG. 8b, the fourth identification bonding pad 2104 may be electrically connected to the power supply bonding pad 211. Meanwhile, the first identification bonding pad 2101, the second identification bonding pad 2102, and the third identification bonding pad 2103 may be electrically connected to the ground bonding pad 212, respectively. Referring to Table 2, the identity information 0001 indicated by the four identification bonding pads 210 of the display substrate may reveal that the place of production of the display substrate is Chengdu, the size is 25 inch and the date of production is 2015 April.

FIG. 8a and FIG. 8b illustrate the enlarged diagram of the electrical connection among the four identification bonding pads 210, the power supply bonding pad 211 and the ground bonding pad 212 when the identity information is 0011 and 0001, respectively. According to the electrical connections shown in FIG. 8a and FIG. 8b, the electrical connections corresponding to the remained identify information (i.e., 1100 and 1101) in Table 2 may also be determined, which may not be illustrated here.

Returning to FIG. 6, to label the four identification bonding pads 210 with the identify information of 0001, the fourth identification bonding pad 2104 may be electrically connected to the power supply bonding pad 211 through the voltage-level signal line. Meanwhile, the first identification bonding pad 2101, the second identification bonding pad 2102 and the third identification bonding pad 2103 may be electrically connected to the ground bonding pad 212 through the voltage-level signal lines, respectively. Thus, the fourth identification bonding pad 2104 may be set at a high level, while the first identification bonding pad 2101, the second identification bonding pad 2102 and the third identification bonding pad 2103 may be set at a low level, respectively.

The identification circuit 32 in the driving chip 3 may recognize the signal or identity information of the four identification bonding pads 210 as 0,0,0,1, respectively. Further, the identification circuit 32 may combine or group the four identification bonding pads 210, for example, into a combined signal, according to the order of the four identification bonding pads 210, i.e., from the first identification bonding pad 2101 to the fourth identification bonding pad 2104. Thus, the combined signal may be 0001, i.e., the obtained identity information of the display substrate to be processed may be 0001.

On the other hand, one or more pieces of identity information may be pre-saved in the driving chip 3, which may be used to analyze the obtained identity information of the display substrate to be processed. For example, referring to Table 2, the identity information 0001 indicating the three properties (i.e., Chengdu, 25 inch and 2015 April) may be pre-saved in the driving chip 3. That is, the pre-saved identity information may be 0001.

After the identification circuit 32 in the driving chip 3 obtains the identity information indicated by the four identification bonding pads 210 through the four second pins 31, the driving chip 3 may determine whether the obtained identity information is consistent with the identity information pre-saved in the driving chip.

Because the obtained identity information of the display substrate to be processed is 0001 and the pre-saved identity information is also 0001, the driving chip 3 may determine the obtained identity information is consistent with the pre-saved identity information, and confirm the display substrate to be processed is correctly used, for example, in a production line.

Then the driving chip 3 may receive a display initialization procedure matching the identity information (i.e., 0001) through the I-O port 34, and further save the display initialization procedure in the memory 35. Based on the display initialization procedure, the driving chip 3 may provide electrical signals to the display substrate for display images.

In another embodiment, the four identification bonding pads 210 in the periphery region 2 of the display substrate may be divided into two groups: a first group of identification bonding pads 210 and a second group of identification bonding pads 210. The identity information represented by each group of identification bonding pads 210 may correspond to at least one property of the display substrate. For example, the identity information indicated by the first group of identification bonding pads 210 may correspond to the place of production of the display substrate, and the identity information indicated by the second group of identification bonding pads 210 may correspond to the size of the display substrate.

Table 3 illustrates a correspondence among place of production, size, and identify information. As shown in Table 3, the four identification bonding pads 210 (i.e., the first identification bonding pad 2101, the second identification bonding pad 2102, the third identification bonding pad 2103, and the fourth identification bonding pad 2104) may indicate two pieces of identity information, and each piece of identity information may correspond to one property of the display substrate.

TABLE 3

Place of production and size vs. identity information

| Display substrate | First group of identification bonding pads | | Second group of identification bonding pads | |
|---|---|---|---|---|
| | Place of production | Identity information | Size (inch) | Identity information |
| Display substrate A | | | | |
| Display substrate B | Chengdu | 10 | 20 | 11 |
| Display substrate C | Beijing | 01 | 25 | 10 |
| Display substrate D | Tianjin | 11 | 30 | 01 |

For example, the first group of identification bonding pads 210 may include the first identification bonding pad 2101 and the second identification bonding pad 2102, and the second group of identification bonding pads 210 may include the third identification bonding pad 2103 and the fourth identification bonding pad 2104. The first group and the second group are used for illustrative purposes, the total number of group may also be 3, 4, or more to identify different types of properties.

Figure 9A:
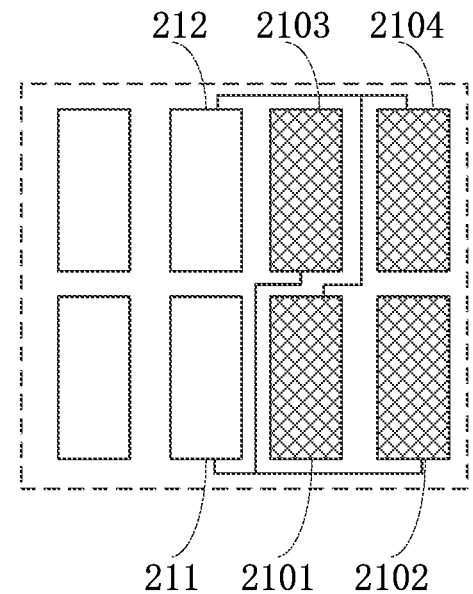
FIG. 9a illustrates an enlarged diagram of an electrical connection among four identification bonding pads 210, a power supply bonding pad 221 and a ground bonding pad 212 when identity information is 0110.

FIG. 9a illustrates an enlarged diagram of an electrical connection among the four identification bonding pads 210, the power supply bonding pad 211 and the ground bonding pad 212 when the identity information is 0110. As shown in FIG. 9a, the first identification bonding pad 2101 and the fourth identification bonding pad 2103 may be electrically connected to the power supply bonding pad 211, respectively. Meanwhile, the second identification bonding pad 2104 and the third identification bonding pad 2102 may be electrically connected to the ground bonding pad 212. Referring to Table 3, the identity information 0110 indicated by the four identification bonding pads 210 may reveal that the place of production and the size of the display substrate is Beijing and 25 inch, respectively.

Figure 9B:
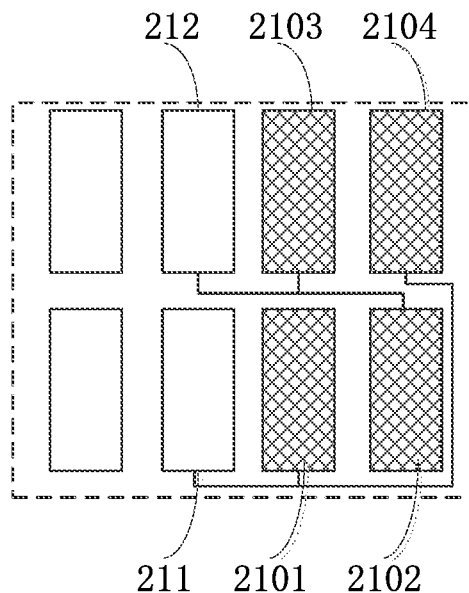
FIG. 9b illustrates an enlarged diagram of an electrical connection among four identification bonding pads 210, a power supply bonding pad 221 and a ground bonding pad 212 when identity information is 1001.

FIG. 9b illustrates an enlarged diagram of an electrical connection among the four identification bonding pads 210, the power supply bonding pad 211 and the ground bonding pad 212 when the identity information is 1001. As shown in FIG. 9b, the first identification bonding pad 2101 and the fourth identification bonding pad 2104 may be electrically connected to the power supply bonding pad 211, respectively. Meanwhile, the second identification bonding pad 2103 and the third identification bonding pad 2102 may be electrically connected to the ground bonding pad 212, respectively. Referring to Table 3, the identity information 1010 indicated by the four identification bonding pads 210 of the display substrate may reveal that the place of production and the size of the display substrate is Chengdu and 30 inch, respectively.

FIG. 9a and FIG. 9b illustrate the enlarged diagram of the electrical connection among the four identification bonding pads 210, the power supply bonding pad 211 and the ground bonding pad 212 when the identity information is 0110 and 1001, respectively. According to the electrical connections shown in FIG. 9a and FIG. 9b, the electrical connections corresponding to the remained identify information in Table 3 may also be determined, which is not illustrated here.

Returning to FIG. 6, to label the four identification bonding pads 210 with the identify information of 1001, the first identification bonding pad 2101 in the first group of identification bonding pads may be electrically connected to the power supply bonding pad 211 through the voltage-level signal lines, and the second identification bonding pad 2102 in the first group of identification bonding pads may be electrically connected to the ground bonding pad 212. Meanwhile, the fourth identification bonding pad 2104 in the second group of identification bonding pads may be electrically connected to the power supply bonding pad 211 through the voltage-level signal lines, and the third identification bonding pad 2103 in the second group of identification bonding pads may be electrically connected to the ground bonding pad 212. Thus, the first identification bonding pad 2101 and fourth identification bonding pad 2104 may be set at a high level, respectively, and the second identification bonding pad 2102 and the third identification bonding pad 2103 may be set at a low level, respectively.

Through the four second pins 31, the identification circuit 32 in the driving chip 3 may obtain the identity information indicated by the two identification bonding pads in the first group of identification bonding pads (i.e., 10), and the identity information indicated by the two identification bonding pads in the second group of identification bonding pads (i.e., 01). Further, the identification circuit 32 may combine or group the four identification bonding pads 210, for example, into a combined signal, according to the order of the four identification bonding pads 210, i.e., from the first identification bonding pad 2101 to the fourth identification bonding pad 2104. Thus, the combined signal may be 1001, i.e., the obtained identity information of the display substrate to be processed may be 1001.

On the other hand, one or more pieces of identity information may be pre-saved in the driving chip 3, which may be used to analyze the obtained identity information of the display substrate to be processed. For example, referring to Table 3, the identity information 10 indicating Chengdu and the identity information 01 indicating 30 inch may be pre-saved in the driving chip 3, which may help to analyze the obtained identity information. That is, the pre-saved identity information may be 1001.

After the identification circuit 32 in the driving chip 3 obtains the identity information indicated by the four identification bonding pads 210, the driving chip 3 may determine whether the obtained identity information is consistent with the identity information pre-saved in the driving chip, through comparing the obtained identity information and the pre-saved identity information. Because the obtained identity information of the display substrate to be processed is 1001 and the pre-saved identity information is also 1001, the driving chip 3 may determine the obtained identity information is consistent with the pre-saved identity information, and confirm the display substrate to be processed is correctly used, for example, in a production line.

Then, the driving chip 3 may receive a display initialization procedure matching the identity information (i.e., 1001) through the I-O port 34, and further save the display initialization procedure in the memory 35. Based on the display initialization procedure, the driving chip 3 may provide electrical signals to the display substrate for display images.

In the disclosed embodiments, no matter the at least two identification bonding pads are divided into multiple groups or not, the driving chip may receive the display initialization procedure matching the identity information through the I-O port after determining the display substrate is correctly used. Based on the display initialization procedure, the driving chip may provide electrical signals to the display substrate for displaying images.

In the disclosed embodiments, the at least two identification bonding pads may be electrically connected to the power supply bonding pad or the ground bonding pad through various electrical connections. For example, some of the at least two identification bonding pads may be electrically connected to the power supply bonding pad or the ground bonding pad through different voltage-level signal lines, some of the at least two identification bonding pads may be electrically connected to the power supply bonding pad or the ground bonding pad through sharing one voltage-level signal line, and the remained bonding pads of the at least two identification bonding pads may not be electrically connected to the voltage-level signal line but may be set in a dummy state or a high-impedance state. Further, the various electrical connections may be determined during the fabrication of the display substrate, or may be programmable according to various application scenarios.

Thus, the various electrical connections of the voltage-level signal lines among the first identification bonding pad 2101, the second identification bonding pad 2102, the third identification bonding pad 2103, the fourth identification bonding pad 2104, the power supply bonding pad 211 and the ground bonding pad 212 shown in FIGS. 7a-9b are only for illustrative purposes, which are not intended to limit the scope of the present disclosure.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method to identify a display device comprising a display substrate and a driving chip, wherein the display substrate comprises a display region and a periphery region including a plurality of first bonding pads electrically connected to metal wires disposed at the display region and a plurality of second bonding pads including at least two identification bonding pads, the periphery region is disposed adjacent to the display region and disposed on the display substrate, the metal wires include a plurality of scanning lines and a plurality of data lines extending from the display region to the periphery region, and the at least two identification bonding pads disposed on the display substrate are electrically connected to voltage-level signal lines respectively and are labeled with identify information of the display substrate according to voltage-level signals provide by the voltage-level signal lines, and wherein the driving chip includes a plurality of first pins, a plurality of second pins and an identification circuit, the first pins are electrically connected to the first bonding pads, the second pins are electrically connected to the at least two identification bonding pads, and the identification circuit is electrically connected to the at least two identification bonding pads through the second pins for obtaining the identify information of the display substrate according to the voltage-level signals at the at least two identification bonding pads, the method comprising:

obtaining, by the identification circuit of the driving chip, the identify information of the display substrate according to the voltage-level signals at the at least two identification bonding pads.

2. The method to identify a display device according to claim 1, further including:

determining whether the identify information of the display substrate obtained from the at least two identification bonding pads is consistent with identify information pre-saved in the driving chip.

3. The method to identify a display device according to claim 2, further including:

receiving, by the driving chip, a display initialization procedure matching the identify information of the display substrate through an input-output port; and saving the display initialization procedure in a memory.

4. The method to identify a display device according to claim 1, wherein:

the plurality of second bonding pads further include at least one power supply bonding pad and at least one ground bonding pad, and each of the at least two identification bonding pads is electrically connected to either the power supply bonding pad or the ground bonding pad through the voltage-level signal line.

5. The method to identify a display device according to claim 4, wherein:

the at least one power supply bonding pad is electrically connected to a power wire; and the at least one ground bonding pad is electrically connected to a ground wire.

6. The method to identify a display device according to claim 5, wherein the obtaining, by the identification circuit of the driving chip, the identify information of the display substrate according to the voltage-level signals at the at least two identification bonding pads further includes:

recognizing, by the identification circuit of the driving chip, the identify information labeled at each of the at least two identification bonding pads as 1 or 0 according to the voltage-level signal at the each of the at least two identification bonding pads, wherein the identify information labeled at an identification bonding pad electrically connected to the at least one power supply bonding pad is recognized as 1, and the identify information labeled at an identification bonding pad electrically connected to the at least one ground bonding pad is recognized as 0.

7. The method to identify a display device according to claim 6, wherein the obtaining, by the identification circuit of the driving chip, the identify information of the display substrate according to the voltage-level signals at the at least two identification bonding pads further includes:

according to a predetermined order of the at least two identification bonding pads, combing the identify information labeled at the each of the at least two identification bonding pads into a combined signal, wherein the combined signal represents the identify information of the display substrate.

8. The method to identify a display device according to claim 7, wherein:

the predetermined order of the at least two identification bonding pads is an order manually set, or a default order determined by the identification circuit in the driving chip.

9. The method to identify a display device according to claim 2, further including:

when the obtained identify information of the display substrate is determined to be consistent with the identify information pre-saved in the driving chip, determining the display substrate to be a display substrate required by an operator.

10. The method to identify a display device according to claim 3, further including:

based on the display initialization procedure, providing, by the driving chip, an electrical signal to the display substrate for displaying an image.

11. The method to identify a display device according to claim 1, wherein:

the at least two identification bonding pads are divided into at least two groups of identification bonding pads; and each of the at least two groups of identification bonding pads corresponds to one piece of identify information of the display substrate.

12. The method to identify a display device according to claim 1, wherein:

the at least two identification bonding pads together correspond to one piece of identify information of the display substrate.

13. The method to identify a display device according to claim 1, wherein:

the identify information corresponds to at least one property of the display substrate; and the properties of the display substrate include place of production, size, thickness, electrical properties, batch code, date of production, status of production, and serial number.

\* \* \* \* \*